United States Patent
Bright

(10) Patent No.: US 8,683,982 B2
(45) Date of Patent: Apr. 1, 2014

(54) PROGRAMMABLE DIESEL FUEL INJECTOR

(75) Inventor: Charles B. Bright, Ames, IA (US)

(73) Assignee: Great Plains Diesel Technologies, L.C., Ames, IA (US)

( * ) Notice: Subject to any disclaimer, the term of this patent is extended or adjusted under 35 U.S.C. 154(b) by 224 days.

(21) Appl. No.: 13/205,787

(22) Filed: Aug. 9, 2011

(65) Prior Publication Data

US 2012/0037127 A1 Feb. 16, 2012

Related U.S. Application Data

(63) Continuation-in-part of application No. 12/853,652, filed on Aug. 10, 2010, now Pat. No. 8,113,179, and a continuation-in-part of application No. 12/853,671, filed on Aug. 10, 2010, now Pat. No. 8,418,676.

(60) Provisional application No. 61/440,655, filed on Feb. 8, 2011, provisional application No. 61/440,665, filed on Feb. 8, 2011, provisional application No. 61/440,671, filed on Feb. 8, 2011, provisional application No. 61/440,684, filed on Feb. 8, 2011.

(51) Int. Cl.
  *F02M 51/00* (2006.01)
  *F02M 37/00* (2006.01)

(52) U.S. Cl.
  USPC .......................................... 123/498; 123/490

(58) Field of Classification Search
  USPC .................... 123/490, 498, 499, 476, 494; 239/102.2, 102.1, 585.1, 900; 251/129.15, 129.21, 129.06; 310/26
  See application file for complete search history.

(56) References Cited

U.S. PATENT DOCUMENTS

| | | | |
|---|---|---|---|
| 608,845 | A | 8/1898 | Diesel |
| 1,059,604 | A | 4/1913 | Gaff |
| 4,022,166 | A | 5/1977 | Bart |
| 4,175,587 | A | 11/1979 | Chadwick et al. |
| 4,180,022 | A | 12/1979 | Khair et al. |
| 5,031,841 | A | 7/1991 | Schafer |
| 5,251,871 | A | 10/1993 | Suzuki |
| 5,280,773 | A | 1/1994 | Henkel |
| 5,697,554 | A | 12/1997 | Auwaerter et al. |

(Continued)

OTHER PUBLICATIONS

Chowdhury, A Finite Element Approach for the Implementation of Magnetostrictive Material Terfenol-D in Automotive CNG Fuel Injection Actuation. Thesis (online), Jul. 2008 (retrieved on Jan. 17, 2012). Retrieved from the Internet:<URL: http://doras.dcu.ie/589/1/A_Finite_Element_Approach_for_the_Implementation_of_Magnetostrictive_Material_Terfenol-D_in_Autom.pdf>.

(Continued)

*Primary Examiner* — Mahmoud Gimie
(74) *Attorney, Agent, or Firm* — McKee, Voorhees & Sease, P.L.C.

(57) ABSTRACT

A programmable diesel fuel injector that increases frequency response and control precision over desired fuel flow rates throughout each injection event. All valve frequency and motional requirements are met by a compensated direct drive, which is enabled by the durable capability of a rare earth alloy to lengthen in a magnetic field. A continuously variable electrical input waveform is predetermined to result in the desired fuel injection rate shape. A magnetostrictive transducer converts voltage and current into continuously variable force and displacement of a master piston acting upon fuel within a closed chamber. A slave piston responds to the fuel pressure changes within the closed chamber and acts upon the spool of a spool valve to eject fuel.

29 Claims, 7 Drawing Sheets

(56) References Cited

U.S. PATENT DOCUMENTS

| | | | |
|---|---|---|---|
| 5,779,149 | A | 7/1998 | Hayes, Jr. |
| 5,810,255 | A | 9/1998 | Itoh et al. |
| 5,860,597 | A | 1/1999 | Tarr |
| 5,875,632 | A | 3/1999 | Kappel et al. |
| 5,875,764 | A | 3/1999 | Kappel et al. |
| 5,979,803 | A | 11/1999 | Peters et al. |
| 6,079,636 | A | 6/2000 | Rembold et al. |
| 6,253,736 | B1 | 7/2001 | Crofts et al. |
| 6,257,509 | B1 * | 7/2001 | Hafner et al. ............... 239/585.1 |
| 6,307,286 | B1 | 10/2001 | Yamazaki et al. |
| 6,364,221 | B1 * | 4/2002 | Czimmek ................... 239/585.1 |
| 6,499,467 | B1 | 12/2002 | Morris et al. |
| 6,526,864 | B2 | 3/2003 | Lindler et al. |
| 6,557,776 | B2 | 5/2003 | Carroll, III et al. |
| 6,568,602 | B1 | 5/2003 | Bram et al. |
| 6,570,474 | B2 | 5/2003 | Czimmek |
| 6,577,776 | B1 | 6/2003 | Hatalsky |
| 6,637,675 | B2 | 10/2003 | Carroll, III et al. |
| 6,758,409 | B1 | 7/2004 | Itoh |
| 6,837,221 | B2 | 1/2005 | Crofts et al. |
| 6,978,770 | B2 | 12/2005 | Rauznitz et al. |
| 7,059,295 | B2 | 6/2006 | Blessing et al. |
| 7,077,377 | B2 | 7/2006 | Schurz |
| 7,140,353 | B1 | 11/2006 | Rauznitz et al. |
| 7,159,799 | B2 | 1/2007 | Cooke |
| 7,196,437 | B2 | 3/2007 | Mori |
| 7,255,290 | B2 | 8/2007 | Bright et al. |
| 7,262,543 | B2 | 8/2007 | Moses et al. |
| 7,334,741 | B2 | 2/2008 | Benson et al. |
| 7,422,166 | B2 | 9/2008 | Hoffmann et al. |
| 7,500,648 | B2 | 3/2009 | Kammerer et al. |
| 2002/0057156 | A1 | 5/2002 | Czimmek |
| 2004/0103885 | A1 | 6/2004 | VanWeelden et al. |
| 2005/0274820 | A1 | 12/2005 | Bright et al. |
| 2007/0007363 | A1 | 1/2007 | Mifuji et al. |

OTHER PUBLICATIONS

Sadi Carnot; Reflection on the Motive Power of Fire; Book; 1988; Dover Publications, Inc.; New York USA.
Rudolf Diesel; Theory and Construction of a Rational Heat Motor; Book; 1894; Spon & Chamberlain; New York USA.
Rudolf Diesel; Diesel's Rational Heat Motor: A Lecture; Lecture/Book; 1897; Progressive Age Publishing Company; New York USA.
M.A, Ganser; Common Rail Injector with Injection Rate Control; SAE Technical Paper Series 981927; 1998; Society of Automotive Engineers, Inc.; California USA.
Department of Defense; Military Standard Piezoelectric Ceramic Material and Measurements Guidelines for Sonar Transducers; MIL-STD-1376B Handbook; 1995; Virginia USA.
Markys G. Cain, Mark Stewart & Mark Gee; Degradation of Piezoelectric Materials; NPL Report CMMT(A) 148; Jan. 1999; National Physical Laboratory; Middlesex, United Kingdom.
M.J. Dapino, F.T. Calkins & A.B. Flatau; Magnetostrictive Devices; Article in Wiley Encyclopedia of Electrical and Electronics Engineering; Wiley, ISBN-13-9780471390527, v12, p. 278-305; 1999; The Wiley Foundation, USA.
Leann E. Faidley, Brian J. Lund, Alison B. Flatau, & Frederick T. Calkins; Terfenol-D Elasto-Magnetic Properties under Varied Operating Conditions Using Hysteresis Loop Analysis; Paper No. 92 as part of the SPIE Conference on Smart Structures and Integrated Systems; SPIE v3329; Mar. 1998; Iowa USA.
Charles B. Bright, Leann Faidley, Adam Witthauer, Evan Rickels & Theodore Donlin; Programmable Diesel Injector Transducer Test Results; SAE Technical Paper No. 2001-01-0381; Apr. 12, 2011; SAE International; Iowa USA.

\* cited by examiner

PROGRAMMABLE DIESEL FUEL INJECTOR

CROSS REFERENCE TO RELATED APPLICATION

This application claims the benefit of U.S. Provisional Application Nos. 61/440,655 filed Feb. 8, 2011; 61/440,665 filed Feb. 8, 2011; 61/440,671 filed Feb. 8, 2011; 61/440,684 filed Feb. 8, 2011; and is a continuation-in-part of U.S. Ser. No. 12/853,652 filed Aug. 10, 2010 and Ser. No. 12/853,671 filed Aug. 10, 2010.

BACKGROUND OF THE INVENTION

The intended operation, potential, and significance of the present invention are perhaps best illustrated by a short review of the foundational thermodynamic principles of heat engines.

In Sadi Carnot's translated words: "The necessary condition of the maximum is, then, that in the bodies employed to realize the motive power of heat there should not occur any change of temperature which may not be due to a change of volume. Reciprocally, every time that this condition is fulfilled the maximum will be attained. This principle should never be lost sight of in the construction of heat engines; it is its fundamental basis. If it cannot be strictly observed, it should at least be departed from as little as possible."

Rudolf Diesel showed that the thermal efficiency of a heat engine is directly related to the rate and temperature at which heat is added to the engine's working fluid. He used the ideal gas law, $pV=nRT$, to show that adding heat to the working fluid while simultaneously maintaining it at a constant bulk temperature turns the most heat into work, avoiding Carnot's "useless re-establishment of equilibrium in the caloric." The working fluid maximum bulk temperature is achieved solely by mechanical compression. This temperature must be above the auto-ignition temperature of the selected fuel. The rate at which fuel of a specific heating value is injected is the rate at which the heat released by the self-ignited combustion of that fuel maintains a constant bulk temperature. Following the gas law, the bulk gas experiences a pressure decrease as the piston withdraws. The pressure decrease varies smoothly, not at a constant rate as would be accommodated by a fixed fuel delivery rate. However, admitting the combustible to maintain temperature results in net work since pressure remains higher than during the compression stroke. Gradually admitting the combustible as prescribed results in maximum fuel economy since heat transfer from the bulk gas is minimized by not letting its temperature rise by combustion.

An indicated efficiency (excluding friction and pumping losses) of well over 60% is theoretically possible. Restated, much more than 60% of the available heat can be converted into mechanical work and much less than 40% of the heat would be lost. This is a conservative percentage according to Diesel himself. (Even without the drive to reduce emissions, raising efficiency is a powerful economic incentive to improve fuel injector technology. Presently, diesel truck engine thermal efficiency is approximately 40% while gasoline engines are 25% to 30%, the lower gasoline engine range being matched by Diesel's prototype over 100 years ago as he reported in his lecture of 1897.)

Achieving Diesel's seemingly simple prescription to maintain the working fluid at a constant temperature as heat is added has proven to be anything but simple. Details on just how formidable this task has been can be read in patents and papers such as Ganser. There are complexities with respect to 1) liquid fuel atomization, vaporization, mixing, and combustion, 2) engines where the load and speed are constantly changing, such as in ground vehicles, and 3) attempting to force a non-linear device such as a solenoid to behave in a less non-linear fashion.

Pollutant formation is controlled by combustion complexities. One of the most important ways to control combustion and thereby control both fuel economy and pollutant formation is the method of admitting the combustible; the method of injecting fuel into the hot, compressed, swirling, oxygen-rich air inside the combustion chamber. Diesel himself noted in his U.S. Pat. No. 608,845 that soot was generated from his coal dust fuel.

The progress of diesel engine pollutant control includes a steady rise in the pressure of the liquid fuel supplied to the injectors. The state of the art is generally in the range of 35,000 psi, with yet higher pressures under consideration.

Much technical literature and prior art patents disclose that metering very quick jets or pulses of standard number two liquid petroleum diesel fuel helps to reduce pollutants. High pressure improves fuel atomization and, for very quick jets, mixes enough finely atomized fuel with fresh, oxygenated air.

To admit the combustible both gradually and/or in quick jets as the engine load and speed vary while minimizing emissions, the means of control within the injector preferably has continuously variable control over both stroke and speed of the valve element with respect to time. Restated, such an injector should rate shape the injected fuel such that the bulk temperature of the working fluid (air followed by combustion gases) does not increase as the fuel is injected over all speed and load conditions of the engine, while simultaneously being able to inject very short individual pulses.

Much creative and ingenious innovation has gone into improving control over diesel fuel injection, which is apparent in trade magazines, society journals, scholarly papers, patents, etc. Ultimately, these efforts are limited by the physics of the two main electrical control technologies used to date: solenoids and piezo-electric ceramics, hereinafter piezo. Solenoid injectors date at least as far back as Gaff in 1913 while piezo injectors date at least from Bart in 1977. Thus, both piezo and solenoids have had the benefit of sustained attention to their limitations. Well into the piezo injector era, Benson et al in 2008 show that piezo has not yet fully replaced solenoid technology.

Ideally, fuel is injected at continuously variable flow rate(s) that match engine needs continuously throughout each injection event, regardless of engine load and speed. The word "programmable" describes the technology of the present invention that is capable of almost arbitrary rate shaping, each rate shape being changeable without altering the injector itself, thereby permitting a closer approach to Diesel's prescription.

In context here, Alexander Graham Bell's invention of the telephone deserves special mention. Bell leapfrogged intensely creative attempts to use the solenoid-operated telegraph to re-create intelligible speech. Key features of his telephone included the ability of the earphone diaphragm to quickly and proportionally follow its undulating analog electrical signal input-exactly the same feature required of a programmable diesel fuel injector that exercises continuous control over the rate at which fuel flows.

Solenoids offer durability, but are unsuitable for programming. Their key characteristic is that the mechanical motion can never be proportional to electrical input. While durable and reliable, neither intelligible speech nor ideal fuel rate shapes can be reproduced by the solenoid. By its operating principle, when a magnetic flux above a threshold value crosses an air gap, its two poles accelerate toward each other, closing the gap until, eventually, they impact each other and, depending on design details, bounce back. The force that accelerates the two poles is inversely proportional to the square of the gap between them, making velocity or position control difficult. Thus, the solenoid is either open, closed, bouncing, or transitioning between these states at a more or less uncontrollable rate.

Although their characteristic is occasionally described as "switching," implying telegraph-like ON-OFF behavior, unlike telegraphs, piezos offer speed and infinitely adjustable displacement within their range, permitting continuous control. The key feature of this technology is that mechanical expansion is proportional to applied voltage. Piezo force and displacement are akin to thermal expansion except electrically controllable and much, much faster. Piezos can be used to reproduce intelligible speech or to rate shape injected fuel, but only for a while. Their critical defect is susceptibility to performance degradation as noted in U.S. Pat. Nos. 5,875,764, 7,159,799, and 7,262,543, MIL-STD-1376, and Cain et al, among many references. This inherent degradation or aging is the Achilles heel of piezo technology, disabling its use in a durable, programmable diesel injector. When lightly loaded to get reasonable life, piezos can offer a telegraph-style ON-OFF speed improvement over solenoids, enabling the faster and smaller multiple pulse injections currently being used to reduce in-cylinder formation of diesel emissions. Despite its speed and proportionality, limiting piezo to telegraph-like behavior to get a reasonable working life makes this approach less than ideal for rate shaping fuel injection.

The US Navy developed a magnetostrictive material that applied a little-known intermetallic alloy of iron and the rare earths terbium and dysprosium, hereinafter "REA", for use in sonar—it is the magnetic equivalent of piezo.

The REA couples a magnetic input to a mechanical output. This alloy offers speed, infinitely adjustable displacement within its range, and the durability to survive on an engine cylinder head. The key feature of this technology is that mechanical expansion is proportional to the current sheet circulating around it. Magnetostrictive displacement and force are akin to thermal expansion except magnetically controllable and much, much faster as noted in Dapino et al and Faidley et al. REAS can be used to reproduce intelligible speech or to rate shape injected fuel without a durability limit. Performance diminishes as temperature rises, but returns fully as temperature falls, an effect controlled by alloy proportions.

U.S. Pat. No. 7,255,290 (the "'290" patent) discloses a simple key to programmable fuel injection rate shaping. The complete patent, especially the discussion comparing the various means of electromechanical transduction, is incorporated herein by reference. In sum, an REA magnetostrictive transducer featuring high compressive pre-stress combined with few turns in its solenoid coil are the key characteristics. It bears repeating that the REA will inherently survive on an engine cylinder head without performance degradation. This technology is durable.

High compressive stress on the REA improves frequency response (speed) in three ways. The first two ways are material parameters intimately related to the mechanism of magnetostrictive transduction, both of which are positively affected by high compressive stress.

First, high stress reduces the variable magnetic permeability of the REA, reducing electrical inductance. Less inductance lowers the voltage needed to dynamically vary the current sheet circulating around the REA element.

Second, high stress increases the variable Young's modulus of the REA. Increased stiffness of the REA element increases its frequency response.

Third, at high compressive stress, the same force requires an REA element of less cross-sectional area. As a result, less of its magnetically-originated mechanical force is expended in accelerating its own mass to position internal valve elements, thereby increasing frequency response yet further.

The theoretical proportionality and high speed of the REA magnetostrictive transducer have now been proven by test. Early data from this testing have been published by Bright et al. The test transducer was subject to fuel pressures of 15,000 to 25,000 psi to compress the REA and then electrically energized to take data. Detailed testing continues, particularly testing at yet higher fuel pressure.

The '290 patent uses transducer output to control a traditional hydromechanical section that masks the full power and capability of magnetostrictive technology. In other words, the conventional needle and related plumbing are not well matched to nor do they take advantage of the greatly improved transducer capabilities. Simulation and preliminary testing indicate that this technology provides sufficient control authority to replace all other sources of motive power, particularly fuel pressure. That is, it is capable of direct drive.

Following tradition, the '290 patent uses a spring to preload the REA, lowering frequency response. Springs that can apply the required compressive preload at the required stiffness and survive the fatigue requirements have either relatively large diameter, as in the case of disc springs, or long length, as in the case of coil springs. Conserving diameter is preferred for any device on an engine cylinder head but this conflicts directly with the transducer advantage of locating the spring closer to the injector tip that protrudes into the combustion chamber. Even though a spring that increases diameter would have the advantage of being shorter with less mass to accelerate, it may be very difficult to fit it onto a particular engine. Friction and fretting wear on the edges of this type of spring would limit injector life.

The second kind of spring adds length and bulk which also add much more mass to be accelerated, lowering frequency response. Besides mass, moving elements that are relatively long and thin tend to bend and vibrate and therefore would need to be guided, adding fabrication cost. The spring itself will interact with the deflections and speed required, slowing the valve element and introducing undesired motions.

Design and fabrication complexity are introduced by the need to compress any spring during assembly. This preload must be applied without subjecting the brittle REA rod to any twist or misaligned end pieces. The mechanism would need to apply the preload carefully and lock it in place for the life of the injector.

The second tradition followed by the '290 patent is to use transducer output to control the drain and fill of a control volume which in turn controls the pressure balance across a needle. Lower frequency response results due to draining and filling time delays plus any inertia and compliance of the control volume. For these same reasons, precision is reduced.

Thirdly, the needle is ballistic and can bounce or oscillate uncontrollably, behavior that again resembles a telegraph. Frequency response and precision are reduced accordingly.

Finally, the '290 patent has no thermal compensation. Expansion differences between the REA and the rest of the injector—critical due to the available displacement—must be compensated for.

The injector of the present invention corrects all of these defects while being shrunk and simplified. Certain critical machining tolerances become unnecessary with this improved configuration. The robust electro-mechanical actuator technology of the present invention provides sufficient electric selectability of continuously variable force and displacement with respect to time thus replacing fuel pressure and achieving valve element speed. This enables fuel injection rates of virtually any necessary shape, including multiple short pulses and/or gradual admission of the combustible fuel from the same injector, wherein the complexity required to form the rate shape is shifted from the simplified mechanical portion of this injector to electrical or electronic means. To achieve fine flow rate control by fine valve element positioning control, it is necessary to disconnect the transducer forces acting on the valve element from the pressure-induced forces that the valve element controls. Since any waveform can be programmed at any time without disturbing the injector or its installation, the injector is termed programmable.

Although, as described hereafter, appearing in the prior art are elements necessary for a programmable diesel fuel injector, none of the prior art discloses an injector that matches an electromechanical transducer with sufficient and precise control authority and frequency response with a suitable hydromechanical section that takes full advantage of such a transducer. In other words, an injector with compensated direct drive does not appear.

Related prior art is cited below for any of the following reasons. The injector of the present invention overcomes the limitations of each citation.

First, related prior art is cited if it features compliance or inertial effects caused by such items as springs or masses that would tend to reduce frequency response. Excess compliance and inertia are made obsolete by the injector of the present invention.

Second, related prior art is cited if a control volume is used, the control volume being used to redirect an outside source of motive power such as fuel pressure. That is, the prior art is cited if a smaller cause and effect is used to control a larger cause and effect, which inevitably lowers frequency response and decreases metering accuracy. In addition to its frequency response, the injector of the present invention has sufficient force and stroke available to control the valve element almost directly, where "almost" is defined as the need to insert thermal compensation.

Third, related prior art is cited if it uses piezoelectric ceramics. The '290 patent details why piezo is not preferred. For all of the different prior art fuel injectors cited below, the '290 patent details how piezos degrade with use, meaning that any injector employing such an actuator is forced to limit stroke and speed to obtain acceptable life. Piezos have been known for decades yet the continuation of the art to rate shape with means that are primarily mechanical, and suffering limited effectiveness as a result, indicates the degree of difficulty that has been encountered in the employment of piezos within fuel injectors. The limited effectiveness of injector control raises emissions and lowers fuel economy.

The tremendous fuel pressure is a potent source of high grade mechanical energy that the prior art has used to assist with the high speed required of the injector by being directed to accelerate and position solid internal mechanical elements. The limitations of prior art electro-mechanical actuator technologies have only permitted them to act more as triggering mechanisms to direct fuel pressure than as modulators of flow rate. Therefore, prior art injectors are either closed, open, or transitioning more or less uncontrollably between these two states. This behavior inherently cannot "gradually admit the combustible" over even a modest load and speed range. Partial rate shaping under specific conditions has been achieved by hydromechanical means, for instance, but the resulting injectors remain inflexible and are more complex and expensive to produce. Thus, rate shaping remains elusive as fuel is merely dumped in, albeit in finer increments but still violating Diesel's prescription that "the combustible is added in such a way, that no increase in the temperature of the gases, consequent upon the process of combustion, takes place, . . . . After ignition, combustion should not be left to itself, but be regulated by an external arrangement, maintaining the right proportion between the pressures, volumes, and temperatures."

U.S. Pat. No. 4,022,166 claims a needle displacement of 0.006 to 0.010 inches in 30-150 microseconds, but suffers from excess accelerated mass, including its biasing spring 58 which reduces its speed, and the use of a piezo stack. This patent further discloses the benefits of multiple injections per engine cycle.

U.S. Pat. No. 4,175,587 points out that the rate of voltage rise across a piezo stack should be controlled within certain limits to avoid arcing between the positive and negative electrodes interleaved between discs in the stack. Depending on the particular configuration, this limit may restrict the speed of any injector using piezo.

U.S. Pat. No. 4,180,022 discloses 1) a piezo actuator with spring preload, 2) that the rate of voltage rise across the piezo stack may need to be limited to prevent arcing, and 3) that the piezo stack temperature may rise unacceptably due to duty cycle.

U.S. Pat. No. 5,031,841 discloses the sensitivity of exposing a piezo stack to water, a common contaminant in fuel. Water is an electrical conductor. The REA is different; because it contains iron, it will "rust" if continually exposed to water for a long period of time.

U.S. Pat. No. 5,697,554 discloses a piezo actuator with spring preload controlling a low pressure fuel chamber, thus maximizing accelerated mass and minimizing the available stress. It further discloses an outward-opening pintle and is thus subject to coking, gum, and other contaminant build-up.

U.S. Pat. No. 5,779,149 uses the fuel as part of the compensation for thermal expansion differences but it does this by an arrangement where the master piston moves in a direction opposite to the slave piston, thus requiring more fluid and accelerating some of that fluid in a first direction followed by a second direction. It uses springs for preloading a piezo stack and a first chamber filled with low pressure fuel. The springs slow its speed and do not allow the stack to take advantage of the pressure available for preloading.

U.S. Pat. No. 5,810,255 uses two piezo stacks, the second being in a novel way to compensate for thermal expansion by clamping. Material frangibility greatly enhances difficulty.

U.S. Pat. No. 5,860,597 uses a pilot-operated control volume.

U.S. Pat. No. 5,875,632 discloses an arrangement where the master piston moves in a direction opposite to the slave piston, thus requiring more fluid and accelerating some of that fluid in a first direction followed by a second direction.

U.S. Pat. No. 5,875,764 discloses a pilot-operated control volume and further discloses that the "switching" behavior of piezo is subject to aging.

U.S. Pat. No. 5,979,803 discloses 1) the desirability of a needle control mechanism independent of fuel pressure and 2) the inability of a piezo actuator to pressurize fuel.

U.S. Pat. No. 6,079,636 uses either a piezo or magnetostrictive actuator as a pump to pressurize the fuel. Both piezo and magnetostrictive materials mimic the force and stroke of thermal expansion except much faster. However, the low bulk modulus of liquid fuels requires much displacement to raise pressure significantly, meaning it will be difficult for such an actuator to provide meaningful pressure and flow. Besides being complex to fabricate, U.S. Pat. No. 6,079,636 will require big and bulky—and therefore slow—transducers.

U.S. Pat. No. 6,253,736 uses relatively large masses which slow acceleration, a bias spring the mass of which also slows acceleration, and a piezo stack. Impact of a valve element causes a voltage spike to appear, which will cause the performance of the piezo stack to degrade even faster than pointed out in the '290 patent, if it does not crack first.

U.S. Pat. No. 6,499,467 discloses the detrimental effects of needle velocity, impact, and sticking.

U.S. Pat. No. 6,526,864 discloses that the compliance and inertia of a pilot-operated control volume reduces the possible frequency response.

U.S. Pat. No. 6,557,776 discloses 1) a complex mechanism to achieve rate shaping, an initial very short pulse followed by an unrestricted injection flow rate, which will raise the bulk gas temperature, 2) usage of control volumes, and 3) the desirability of providing small spray orifices to increase injection duration at low speed and light load.

U.S. Pat. No. 6,568,602 discloses 1) the desirability of different rate shapes across the spectrum of engine operating speed and load, 2) the desirability of metering accurate, small doses, and 3) that the moving needle valve element is deliberately allowed to impact the piezo stack. Impact causes a voltage spike to appear, which will cause the performance of the piezo stack to degrade even faster than pointed out in the '290 patent, if it does not crack first.

U.S. Pat. No. 6,570,474 shows the basic, simple component arrangement but uses preload springs and limits the REA compressive preload to 5-15 MPa. This ensures that the REA is bulky and has a lower Young's modulus and higher magnetic permeability. The added mass of the preload springs slows it further.

U.S. Pat. No. 6,637,675 discloses a complex injector with two needles.

U.S. Pat. No. 6,758,409 uses pressurized fuel to compensate for thermal expansion differences but employs springs to preload a piezo stack. Voltage is applied to the stack continuously until it is removed for injection to occur by a claimed stroke of up to 0.25 mm. Designing the injector to be closed with voltage applied means that removing voltage may have the unfortunate consequence of allowing continuous injection in the event of a fault that disables that voltage. If the needle opened by traveling in the opposite direction, there would be no need for the stack to be energized to the pre-expanded condition.

U.S. Pat. No. 6,837,221 discloses 1) the desirability of an abrupt end to fuel injection to prevent the formation of unburned hydrocarbon emissions, 2) a pilot-operated control volume, and 3) the undesirability of pilot-operated control valve member oscillations.

U.S. Pat. No. 6,978,770 discloses that rate shaping can relieve the need to recirculate exhaust gas to achieve emissions reduction. However, it also discloses 1) a hollow piezo stack penetrated by its output rod, 2) a spring preload, 3) a pilot-operated control volume that reduces the speed and precision with which the needle can be operated because fuel requires time to flow into and out of the volume, and 4) that piezo stack voltage is permitted to decay passively.

U.S. Pat. No. 7,059,295 discloses the benefits of cavitation, throttling, rate shaping, and multiple injections, but resorts to complexities such as multiple pressures to achieve it.

U.S. Pat. No. 7,077,377 discloses 1) excess mass and 2) that the amount of dead volume has adverse effects on the motional dynamics of the master and slave pistons.

U.S. Pat. No. 7,140,353 discloses a piezo actuator that operates a pilot valve on a control volume.

U.S. Pat. No. 7,159,799 discloses a mechanically complex injector driven by a piezo actuator in which only discrete voltage levels are used, thus limiting its proportionality and resulting in a limited selection of rate shapes. The patent further discloses that actuator lifetime is enhanced by reducing the time at which the injector is at a high energization level.

U.S. Pat. No. 7,196,437 inserts bias magnets in line with the magnetostrictive transducing material. Adding inert material forces the entire transducing member element to lengthen, adding mass to accelerate. Since the bias magnets are made from a different material, column buckling strength is reduced, for which diameter must be increased to compensate. The presence of bias magnets reduces magnetic permeability and therefore reduces electromechanical coupling, forcing input energy requirements to increase in compensation. Bias magnets will add bulk and make handling difficult.

U.S. Pat. No. 7,262,543 discloses a means of ascertaining the deterioration over time of the performance of piezo material.

U.S. Pat. No. 7,334,741 discloses an injector with a mechanical sleeve for achieving a rate shape.

U.S. Pat. No. 7,422,166 discloses that electromagnetic solenoid actuators achieve lower opening force and a slower rise of force over time. This limits speed.

U.S. Pat. No. 7,500,648 discloses a preload spring and excess accelerated mass.

U.S. Pat. No. 7,934,668 discloses an inflexible, mechanically complex injector.

U.S. Pat. No. 7,967,223 discloses the time delays of a hydraulic servo mechanism but then uses an inflexible, mechanically complex injector to overcome the larger and more expensive piezo actuator otherwise envisioned. The patent further discloses use of pressure to assist in needle actuation.

With respect to diesel fuel injector actuators and exhaust system equipment, it is of particular importance that the need for platinum group precious metals be reduced or eliminated. These metals are referred to as precious due to their cost. Precious metals have been used as electrodes in piezo stacks, raising their cost. Within the exhaust system, precious metals are used to catalyze beneficial chemical reactions. Better control over in-cylinder combustion will reduce or may even eliminate the need for their use.

Therefore, it is an object of the present invention to improve upon and overcome the foregoing drawbacks present within prior art devices.

It is an object of the present invention to provide a durable, compact, and programmable diesel fuel injector that can also be retrofitted to existing engines.

These and other objects, features or advantages of the present invention will become apparent from the specification and claims.

BRIEF SUMMARY OF THE INVENTION

The robust electro-mechanical actuator technology of the present invention provides sufficient continuously variable force and displacement with respect to time thus replacing fuel pressure and achieving valve element speed. To achieve fine flow rate control by fine valve element positioning control, it is necessary to disconnect the transducer forces acting on the valve element from the pressure-induced forces that the valve element controls.

Three main points are summarized here. First, high pressure is the state of the art. Second, fast injector speed is required. Third, more precise fuel metering with respect to time, a characteristic termed rate shaping, is needed. The ability to "gradually admit the combustible" offers the potential of greatly increasing fuel economy. Very quick jets of finely atomized fuel offer the potential of preventing the formation of pollutants, thus minimizing or potentially eliminating exhaust system equipment to neutralize any pollutants.

BRIEF DESCRIPTION OF THE DRAWINGS

Numerous other objects, features, and advantages should now become apparent upon a reading of the following detailed description taken in conjunction with the accompanying drawings, in which.

DETAILED DESCRIPTION OF THE PREFERRED EMBODIMENT

Figure 2:
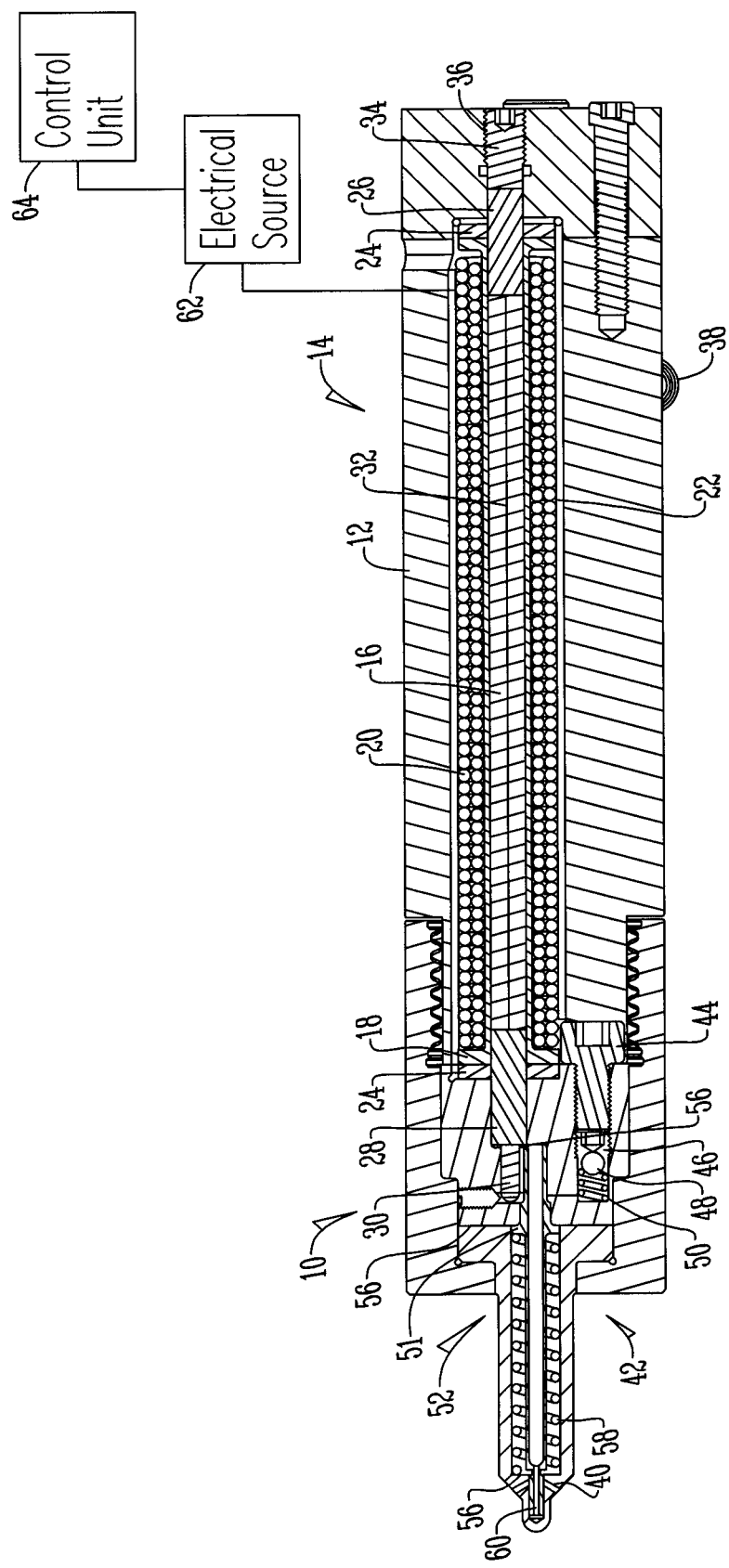
FIG. 2 is a section view of one embodiment of a prototype injector of the present invention.

Referring to FIG. 2, in one embodiment, the injector comprises a case or housing 12 containing an REA magnetostrictive transducer 14. The REA magnetostrictive transducer 14 employs an REA element or rod 16 with its grain oriented in the axial direction, a bobbin 18 concentric to the rod 16, an energizing helical winding or solenoid coil 20 and a magnetic flux return path consisting of a ferromagnetic sheath 22 concentric to the coil 20, ferromagnetic end rings 24, ferromagnetic tail pole 26, and ferromagnetic head pole 28. The rod 16 is in operative disposition with a master piston 30 through the ferromagnetic head pole 28.

The rod 16 may be formed of a rare earth/transition metal magnetostrictive material. For example, the rod 16 may be formed of a grain-oriented polycrystalline rare earth/transition metal material of the formula $Tb_xDy_{1-x}Fe_{2-w}$, wherein $0.20<=x<=1.00$ and $0<=w<=0.20$. The grains of the material have their common principal axes substantially pointed along the growth axis of the material which is within 10° of the $\lambda_{111}$ axis.

As the rod 16 has its grain oriented in the axial direction, the rod 16 is provided as a solid magnetostrictive material with a favored direction of magnetostrictive response formed into a shape with ends that are substantially parallel to each other and substantially perpendicular to the favored direction of magnetostrictive response.

The shape of the rod 16 may be a cylinder, ellipsoid, parallelepiped, prismatic, other similar shapes, or other suitable shapes. The rod 16 may have a transverse dimension perpendicular to the direction of magnetostrictive response substantially smaller than one quarter wavelength at the electromechanical resonant frequency of the apparatus. The rod 16 may have a length in the direction of magnetostrictive response of no greater than one quarter wavelength at the electromechanical resonant frequency of the apparatus.

Figure 3:
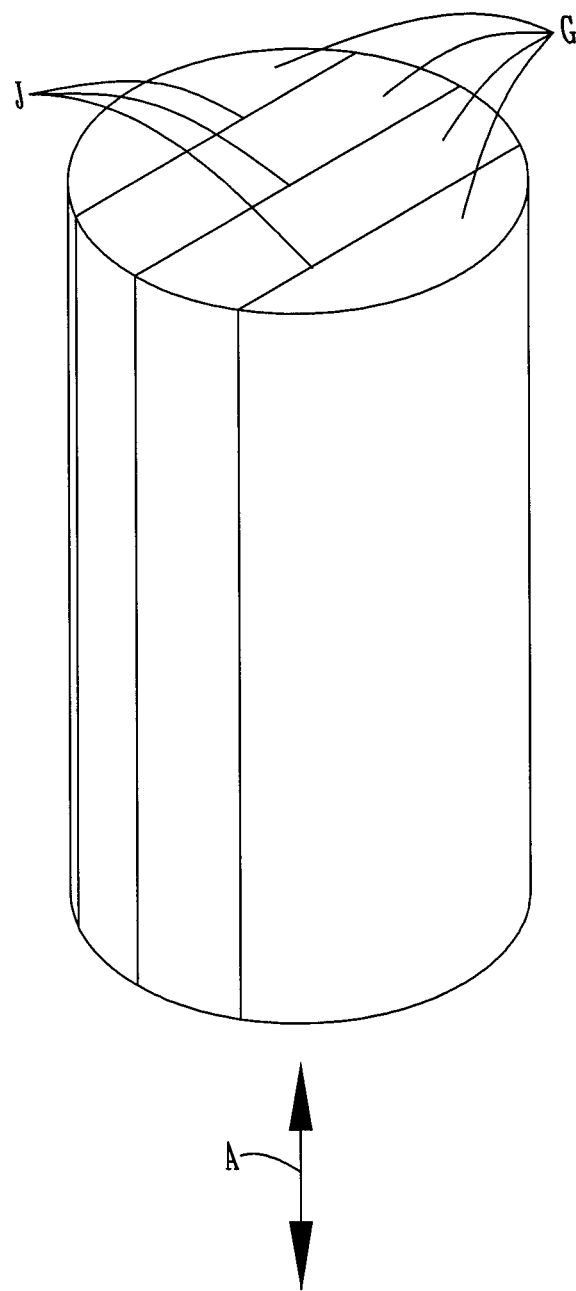
FIG. 3 is an isometric view of the REA rod element, illustrating the orientation of the eddy current control laminations with respect to the magnetomechanical axis.

As discussed in more detail below with regard to FIG. 3, the rod 16 may be divided by a plurality of joints 32 into an element of discrete magnetostrictive slabs.

The rod 16 position is preferably symmetrical inside the coil 20. A screw 34 provides axial position adjustment of the rod 16 inside the coil 20.

The bobbin 18 serves as a form for the coil 20. As is understood, the bobbin 18 is made of material that can withstand exposure to fuel. The bobbin 18 preferably leaves only a very thin gap between itself and the rod both to minimize leakage of magnetic flux and to allow a small flow of fuel to pass through the transducer 14, providing temperature conditioning as needed.

The coil 20 is comprised of insulated electrically conductive wire wound onto the bobbin 18 in a tight helix. For fast response, the coil 20 is wound using the fewest turns and layers of wire. This lowers transducer inductance and therefore lowers the voltage requirement for fast response. To get the necessary magnetic field, then, requires high current through this fast coil. Wire diameter and number of layers are determined by source capability and eddy current loss considerations as well as the primary consideration of speed.

As is understood, such a coil produces a concentrated axial magnetic field which extends somewhat beyond the ends of the coil proper. Accordingly, it will be understood that the effective length of the coil 20 in producing magnetostriction in the rod 16 may extend beyond the coil 20 itself and encompass one or both ends of the rod 16 as required. The coil 20 may be located concentric with the rod 16 and coaxial to its favored direction of magnetoelastic response. The coil 20 may be adapted to excite the rod 16 into mechanical motion.

Despite the extent of the magnetic field somewhat beyond the ends of the coil 20 proper, it is preferred that the coil 20 extend somewhat beyond the ends of the rod 16 proper, to reduce non-uniform magnetostriction and maximize rod 16 transduction.

As is understood, lines of magnetic force have no beginning and no end. To minimize the energy required to generate a field strength sufficient to excite the rod 16, a path of preferably ferromagnetic materials is provided to guide the lines of magnetic force around the outside of the coil 20 from one end of the rod 16 to the other. This path consists of the tail pole 26, head pole 28, end rings 24, and sheath 22. Both the tail pole 26 and head pole 28 abut against the ends of the rod 16. The flux return path may be in magnetic communication with the rod 16. The flux return path may include ferromagnetic materials. For example, the flux return path material may be ferrite, the like, or other suitable material. The flux return path may substantially surround the coil 20. See FIG. 4.

The tail pole 26 is fixed axially by the position of an adjustment screw 34. The head pole 28 displaces with the magnetostriction of the rod 16 and directly drives the master piston 30. Both poles 26 and 28 provide concentric and axial alignment of the rod 16 and are preferably provided with clearances sufficient only to permit axial motion. The adjustment screw 34 locates the rod 16 in the center of the coil 20, maximizing transduction.

A case 12 provides the structure of the fuel injector. The case 12 is preferably made of a non-ferromagnetic material. The case 12 incorporates threads 36 for the adjustment screw 34 to position the tail pole 26 and rod 16. The case 12 incorporates two fittings 38, one to admit pressurized fuel from an external pressurized common rail supply and the other to return internal leakage to the fuel supply tank. The case 12 incorporates the nozzle holes 40 that spray the injected fuel into the engine combustion chamber.

The internal fuel rail provides constant fluid communication between high pressure fuel from the external common rail (not shown) and the internal spool chamber 42 adjacent the nozzle orifices 40.

A set screw 44 has a hole drilled in it to connect a hydraulic chamber to the fuel rail. One side of the set screw 44 has a frustoconical seat 46 that forms a sealing surface with the ball 48, permitting flow in only one direction. The ball 48 acts as the check within a check valve. A spring 50 acts to bias the ball 48 onto the frustoconical seat 46. Thus a certain fuel pressure differential across the check valve is required before flow is permitted. The position of the set screw 44 adjusts the pressure set point of the check valve.

An alternative embodiment to the check valve is a series of passageways arranged to force the fuel to change its direction of flow many times. A pressure drop is caused by each change of direction because the flow must be decelerated in a first direction and accelerated in a second direction. This labyrinth of passages is sized to provide an effective pressure seal during the relatively short amount of time in which an injection event occurs. The labyrinth can be made of sufficient internal size to effectively resist plugging by contaminant particles that may be present. The labyrinth has no moving parts to impact or fatigue or wear, will thus also be immune to vibration, and can be arranged in a manner that saves space.

Excess, un-controlled, and/or inadvertent leakage should be minimized since it represents a loss of energy. A further consequence of leakage is that the temperature of depressurized fuel rises. Despite these drawbacks, the present invention deliberately permits internal leakage for several reasons. First and foremost, a clearance channel seal permits unimpeded axial motion of each component within its bore. Second, an elastomeric seal is unlikely to survive the combination of sealing such tremendous fuel pressure, the displacement of each cycle, and the number of cycles the injector will operate over its life. Third, a flexible metal seal that can meet the same combination will likely be difficult to fabricate reliably and therefore expensive. Finally, the leakage can be used to cool both the rod 16 and the coil 20. This intentional leakage is returned to the engine fuel supply tank.

For a given pressure difference, the leakage flow rate is determined by fuel viscosity and the width and length of the channel formed between the component and its bore. Effective sealing is accomplished by choosing clearances that, in combination with fuel viscosity, only permit a small flow despite the tremendous pressure. Precise fabrication methods are preferred and available for choosing the leakage flow rate. Concentric self-alignment of the component in its bore is enabled by adding grooves around the component. The grooves balance the pressure at that point in the channel by evenly distributing it in the circumferential direction.

The hydraulic chamber 42 is in constant fluid communication with the internal fuel rail by means of the check valve and with the close-fitting diametral clearance seals between the master piston 30 and its bore, a slave piston 51 and its bore, and the spool tail seal and its bore. Their combined leak rate is small enough to be considered of negligible importance during an injection event. That is, the leak rate does not affect the dynamic performance of those moving components that are sealed by these small channels.

The small flow continually rinses the hydraulic chamber 42 with fresh fuel and can be routed to provide temperature conditioning of the rod 16 and coil 20. Corrosion of the rod 16 due to water contamination is a slow process, meaning that exposure would have to be continuous and long term before damage can be done to the rod 16. The presence of enough water in the fuel for a long enough period of time to cause rod 16 corrosion while leakage is occurring likely means that other components will suffer similar damage and/or the engine is inoperable since water does not burn.

Expansion of the rod 16 drives the master piston 30 against the effectively closed hydraulic chamber 42. "Effectively closed" means that the hydraulic chamber is in fluid communication with the pressure source, but through a check valve that acts to close that volume for the time in which spool motion is required. That is, the pressure added to the hydraulic chamber 42 by the rod 16 expansion cannot cause a significant amount of fluid to leak through the check valve and out of the hydraulic chamber within the few milliseconds of time that the spool 52 is in motion to allow fuel to be injected.

As shown by the figures, the instant invention provides a mechanism designed to take advantage of the tremendous fuel pressure to provide the compressive preload of greater than fifteen megapascals on the rod 16, thus avoiding springs. One side of a master piston 30 is exposed to fuel pressure such that the other side of the head pole 28 presses against the rod 16. The master piston 30 is adapted to subject the rod 16 to a static compressive stress that is associated with the rod 16. The master piston 30 may subject the rod 16 to a static compressive stress magnitude of greater than fifteen megapascals along the favored direction of magnetostrictive response with an effective stiffness no greater than one-fourth the stiffness of the rod 16 without the rod 16 being subjected to a magnetic field. The ratio of areas between the master piston 30 and the head pole 26 is designed to optimize the compressive stress on the rod 16 with respect to the available fuel pressure. With this configuration, the rod 16 directly drives the master piston 30.

Figure 5B:
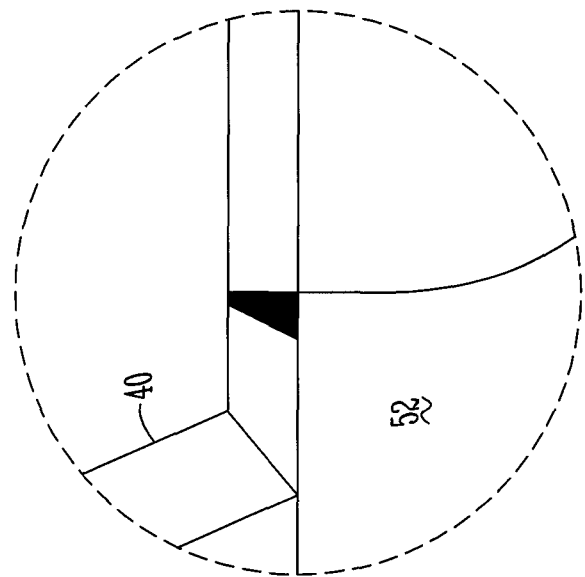
FIG. 5B is a exploded section view of hydromechanical detail of one embodiment of the injector of FIG. 5A.
Figure 5A:
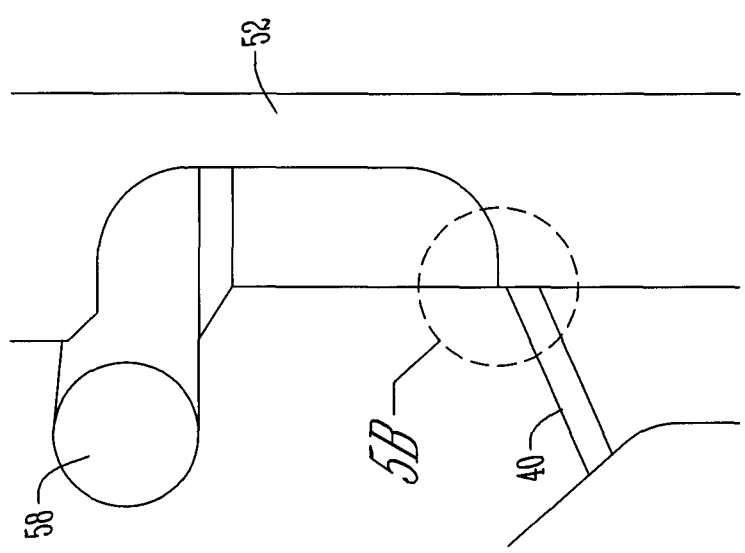
FIG. 5A is a section view of hydromechanical detail of one embodiment of an injector.
Figure 6:
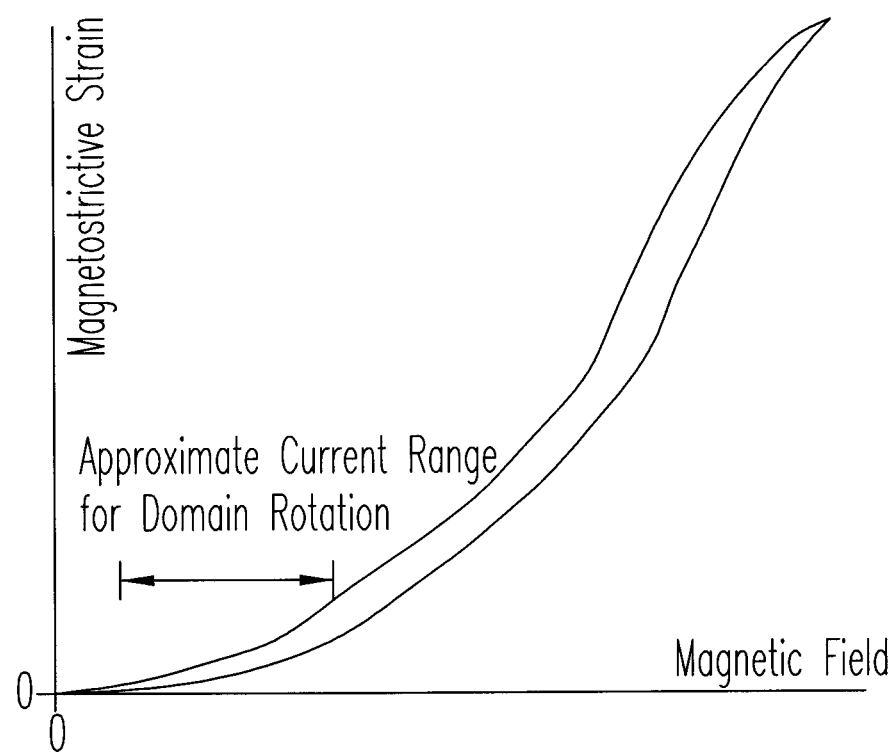
FIG. 6 is a graph that plots magnetic field versus magnetostrictive strain.

The slave piston 51 is the annular area indicated in FIG. 5. The cross-sectional area of the slave piston 51 is chosen with respect to the cross-sectional area of the master piston 30, thus permitting matching of displacement and force available from the transducer to the displacement and force required to operate the spool valve element. The spool tail seal serves to align and seal the spool 52.

Spool faces 56 are any surface having any geometric vector component parallel to the cylindrical axis of the spool 52. This definition includes those portions of any curved surfaces where vector components of the fuel pressure would act in the axial direction. Spool faces 56 are sized to balance, and therefore cancel, the hydrostatic forces generated in the axial direction by fuel pressure. This renders spool position immune to supply pressure variations or, in other words, forces acting axially on the spool 52 to control injection flow rate are completely disconnected from any forces induced by rail pressure.

The radius of the spool edge that opens and closes the nozzle orifices 40, that is, the radius of the spool edge that displaces in front of the nozzle orifices 40, is one variable that can be controlled to affect the abruptness with which the injector opens and closes. A second, similar variable that cooperates with the first variable is the inlet geometry of each nozzle orifice 40. The edge may help cut larger contaminant particles that may be present in order to flush them away and maintain performance.

The spool valve element 52 may be located coaxial or parallel to the favored direction of the rod's magnetoelastic response. The spool valve element 52 includes a sealing component (not shown) such as a conical shape mated to a conical shape seat, a curvilinear shape mated to a conical shape seat, a conical shape mated to a planar shape seat, and planar shape mated to a planar seat, or the like.

A spring 58 biases the spool 52 toward its closed position. Spring stiffness is chosen with respect to spool mass to achieve a desired resonant frequency. In its sealed position, the edge has retracted by approximately fifty micrometers past the nozzle orifice 40, permitting abrupt opening and closing without severe impact. The underlap provides room in which to both accelerate and decelerate the spool 52.

An enclosure protects the end of the spool 52 from products of combustion or exposure of fuel to heat, such as coke, gum, and so forth. To eliminate hydraulic lock caused by spool movement within the end enclosure, an axial pressure relief hole 60 is drilled through it and connected to the injector vent line.

Operating Description

As assembled and without fuel pressure, the spool 52 is biased closed by its spring 58. Similarly, the check valve is biased closed by its spring 50.

With the appearance of pressure, fuel flows into the hydraulic chamber 42 to pressurize it. A small leakage flow rate to vent is established past the master piston 30 and spool tail seals.

Pressure applied to the master piston 30 is transmitted as a force to the head pole 28 which in turn applies a compressive stress preload to the rod 16. Since no material is infinitely stiff, the rod 16 responds to compressive stress with a compressive strain. In other words, it is shortened by the preload. The master piston 30 and the head pole 28 move within their bores by the amount that the rod 16 shortens. These two components compress slightly too. The compression of all three components causes the volume of the hydraulic chamber 42 to increase by a corresponding amount, that volume being filled by pressurized fuel.

The rod 16 is compressed to an initial bias state, $-T_b$, where the mathematical negative sign (−) is in accordance with the convention for compressive force, stress, and strain. $-T_b$ results in a compressive strain, $-S_b$. The corresponding secant Young's modulus between the free, unmagnetized state and the compressed, unmagnetized state is then:

$$Y_b = (-T_b - 0)/(-S_b - 0)$$

which is a positive quantity. Because field H is zero throughout this compression, $Y_b$ may be taken to be $Y_b^H$.

Because it is a magnetostrictive material, the compressive stress preload rotates magnetic domains. Because each magnetic domain exhibits polarity, yet the completed rod 16 does not, the domains are aligned with respect to each other such that their magnetic moments cancel each other. See FIG. 4.

Figure 4:
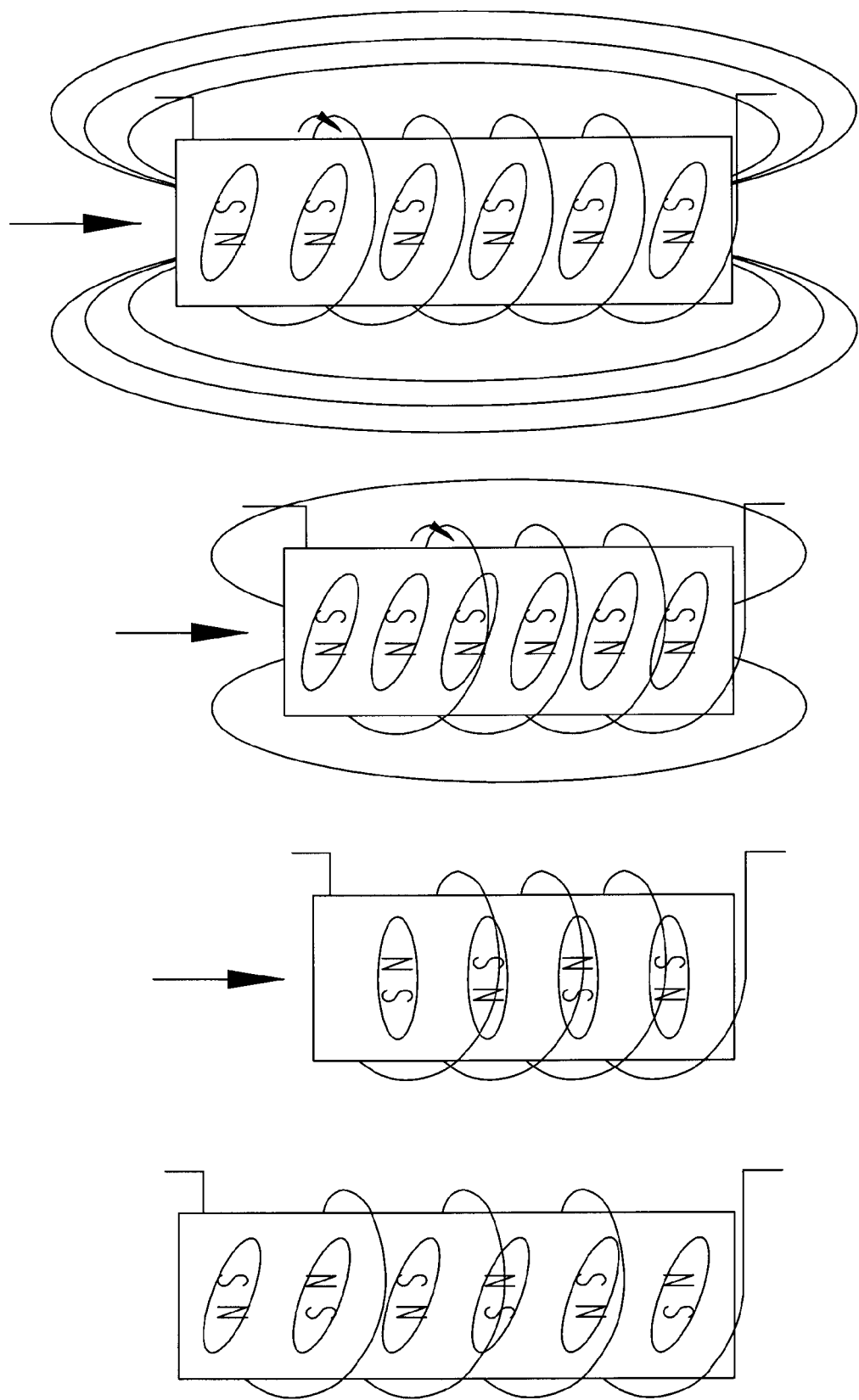
FIG. 4 is a schematic diagram of a north-south (N-S) polarity orientation of the magnetic domains within an REA rod element.

Upon application of a current ±I of either polarity to the coil 20, a sheet of electrons circulating in one direction or the other is established. As is known, the sheet of circulating electrons results in a magnetic field ±H, the polarity depending on the direction of circulation. This field generates magnetic lines of force that cross into the rod 16 with a corresponding magnetic flux density ±B, the magnitude of which depends upon the magnetic permeability of the entire magnetic circuit, including the rod 16. As shown in FIG. 4, lines of flux close back on themselves through the flux return path which, together with the rod 16, forms the entire magnetic circuit. The rod 16 is unusual in that its variable permeability p is influenced by both the stress T and field H, a magnetic effect corresponding to the elastic effect wherein its Young's modulus Y is influenced by both the stress T and field H.

The rod 16 transduces part of the resulting flux density ±B into a generally proportional elastic response as follows. Initially, compressive stress magnitude must increase because strain cannot occur without increased stress. This stress acts outwardly, changing the force balance of all dynamic components. Static force balance is restored with an elongated rod 16 due to positive strain. When the rod 16 lengthens, it displaces the master piston 30 by exactly the same amount.

Figure 1:
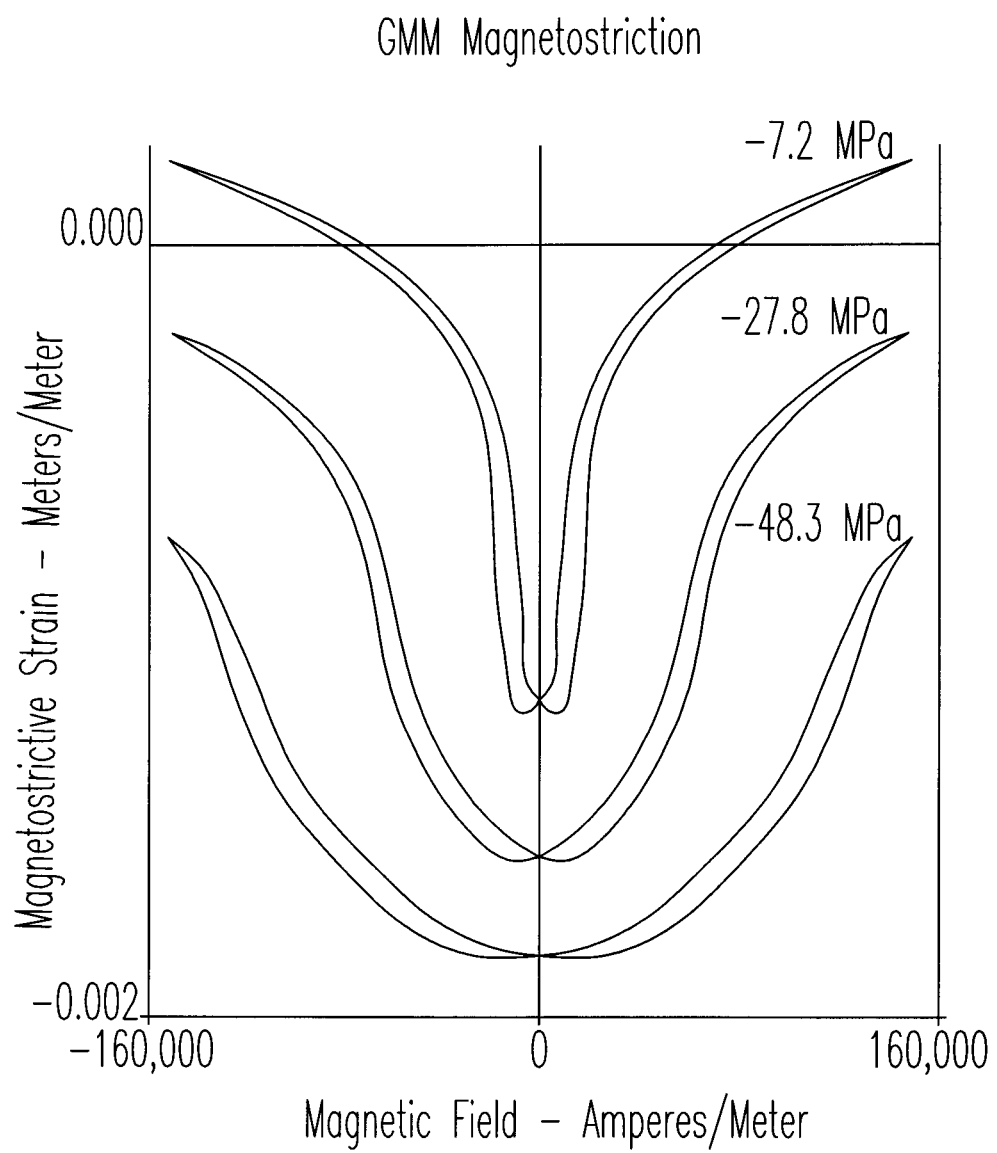
FIG. 1 is a graph of absolute magnetostrictive strain as a function of magnetic field strength for three different constant compressive stresses.

The injector of the present invention improves its precision of positioning, the accuracy with which the spool moves to a desired position. By eliminating the need to compensate elsewhere, speed improves. FIG. 1 shows distinct hysteresis loops. The most noticeable problem is that the desired output of strain is different, depending on which direction it is approached from.

The origin of the hysteresis is the motion of the individual magnetic domains that make up the rod 16. An analogy is to consider what happens when attempting to smoothly pour a mixture of many ice cubes and water. When tilting the container, some water can be poured out while the ice cubes interact with each other to stay in position. At a critical pour angle, the ice cubes break free and an avalanche occurs. However, if the container is continuously shaken as the pour angle is increased, a much smoother and more predictable flow occurs.

Figure 7:
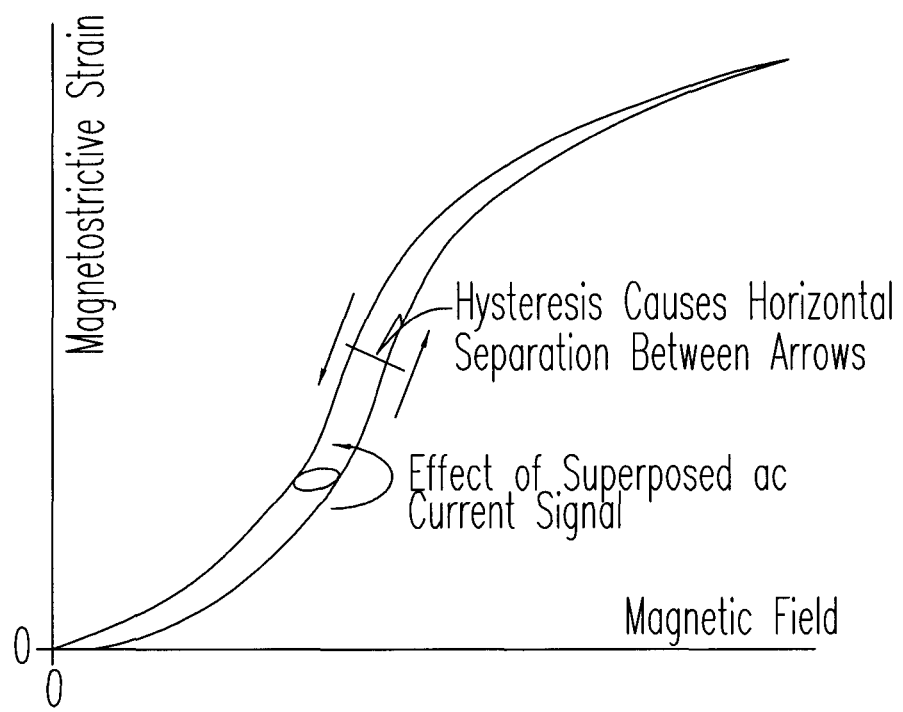
FIG. 7 is a graph that plots magnetic field versus magnetostrictive strain.

In a comparable fashion as illustrated in FIG. 7, the present invention applies a small alternating signal to the coil 20, to provide an excitation signal within the coil 20 consisting of the main current signal with a superposed alternating signal approximately the width of the hysteresis loop of the REA, which decreases the inhibition on magnetic domain rotation, an enhancement that achieves more precise positioning of the valve spool 52, from either the open or closed directions, and less requirement for the electronic controller to introduce an artificial compensation, thus simplifying the controller while at the same time increasing its speed.

When unmagnetized, the rod 16 of the present invention features an equal number of magnetic domains rotated in opposite directions because the rod 16 itself does not remain magnetized after removal of the magnetic field. See FIG. 4. Rotating the magnetic domains into alignment just before injection is required reduces total injector time delay in two ways. First, the time required to rotate domains is eliminated. Second, a time-varying magnetic field imposed on an electrical conductor, the REA in this case, induces eddy currents within that conductor. Eddy currents sap energy from the source magnetic field and induce their own magnetic field opposite to the source magnetic field, thus shielding its effect on the electrical conductor until the magnitude decays sufficiently.

The total time delay caused by both domain rotation and eddy current shielding is minimized or eliminated by exciting the solenoid coil 20 with a current of magnitude sufficient to accomplish domain rotation in the rod 16 just before beginning the main excitation intended to cause injection. See FIG. 7.

If the piston 30 was allowed to come to rest, the energized rod 16 would be stiffer. This is because, by definition, for the same stress the elongated rod 16 exhibits less strain. The magnetic field has modified Young's modulus.

Thus, control of the current into the coil 20 controls the expansion of the rod 16. The rate at which current increases and its maximum magnitude are both transduced by the rod 16 into a corresponding mechanical expansion waveform.

Long term fuel supply pressure variations can be detected and compensated for by the magnitude of the electrical current preferred to operate the injector 10. Maximum injector rate shaping performance thus continues even though a maintenance or possible fault condition has been detected in the fuel system.

Fuel supply pressure variations can be detected by "pinging" the rod 16 with a small electrical pulse between injection events. That pulse determines the magnetic permeability of the rod 16 and therefore the compressive stress that it is subject to.

At its boundary with the head pole 28, the expanding rod 16 displaces the head pole 28 and master piston 30 directly and as a unit. The piston motion displacement into the hydraulic chamber 42 acts to raise the pressure in the hydraulic chamber 42 and displaces the corresponding volume of fuel. After ensuring that the check valve is closed, the volume displacement is compensated by a corresponding displacement of the spool 52, assuming the fuel in the hydraulic chamber 42 can be considered incompressible and further assuming that the leakage rates are negligible during the time required for a fuel injection event. Fuel is injected as spool 52 axial motion occurs.

Therefore, before the master piston 30 is displaced into the hydraulic chamber 42, the chamber 42 is pressurized with the pressurized force in all directions. When the master piston 30 is displaced into the hydraulic chamber 42 as a result of the electromechanical force created by the transducer 14 the spool 52 is moved as a result of that force being communicated into the chamber 42. Thus the electromechanical force is communicated in a first vector direction against the spool 52 while the pressure forces in the chamber act perpendicular to the end faces of the spool 52. In this manner the valve or spool 52 is in communication with the transducer 14 and the spool 52 thus vectorially separates transducer forces from pressure induced forces to supply fuel to the engine combustion chamber.

The ability to control current provides the continuously variable stroke and speed claimed for this injector. Positioning of the master piston 30 that forms part of the wall of the effectively closed hydraulic chamber 42 controls the pressure in that chamber 42. Control of hydraulic chamber 42 pressure positions the slave piston face 56 of the spool 52, which controls fuel injection into the engine combustion chamber.

Maximum speed is achieved by matching the dynamic interactions between all components. Transfer of power between each component is maximized when the impedance of a load is matched to the impedance of its source. The injector 10 is thus designed to minimize the undesired loss of power through damping and friction while matching source and load impedances.

The desired fuel injection rate shape for any particular engine combines Diesel's original specification of adding fuel in a manner that does not raise the bulk temperature of the combustion gases with those characteristics necessary to minimize pollutant formation. For a given nozzle configuration, this rate shape will determine spool positioning. Anticipating that many individual pulses within a single injection event is the ideal rate shape, all parasitic drag that slows the spool 52 is preferably identified and minimized. Parasitic drag includes the energy storage represented by accelerated masses and compressed stiffnesses as well as the energy dissipation represented by the many places friction will occur.

Importantly, the rate shape can continuously match the addition of heat to the engine working fluid as the engine piston begins to accelerate. The working fluid volume thus expands at a continuously changing rate and the injector of the present invention injects fuel at a matching continuously variable rate such that heat is added to the working fluid at a continuously variable rate that does not alter its bulk temperature.

Once a required position is determined, achieving it can be realized by considering dynamics of the individual fuel volumes within the injector tip, the ratio of piston 30 to head pole 28 area, the configuration of the rod 16, and the capability of the electrical power supply. As a result, at the very least, all of the stated objectives have been met.

Reducing current reduces the magnetic field intensity. The rod 16 responds by contracting axially, lowering the pressure in the hydraulic chamber 42. The spring 58 accelerates the spool 52 in the direction of closing the injector 10.

The master piston 30 may be controlled by the rod 16 in an analog fashion. Alternatively, the piston 30 may be controlled by the rod 16 in a binary fashion. Optionally, the piston 30 may be controlled by the rod 16 in a pulse width modulated fashion. Regardless of the control fashion, the piston 30 may correspondingly control the opening and closing of the injector 10 by controlling the axial displacement of the spool 52. The method of control and the rates of motion comprise a rate shape.

The compensated direct drive configuration of the present invention permits separate injection events up to a frequency in the neighborhood of the damped natural frequency of the spool 52 and spring 58 system. In other words, the spool 52 can be excited to oscillate sinusoidally;

between the fully open position and the fully closed position, between a partially open position of any amount and the closed position, between the fully open position and a partially closed position of any amount, and between a partially open position of any amount and a partially closed position of any amount.

The frequency of this oscillation can be any frequency up to a region past the natural frequency of the spool 52 and spring 58 system where the oscillations are substantially reduced to the point of being ineffective. In addition, the amount of partially open or partially closed can be varied throughout each injection event by varying the input current as desired. That is, an alternating current of the desired spool 52 frequency and alternating magnitude can be superposed onto the main current signal into the coil 20.

The ability to realize a highest possible speed from this injector 10 is enhanced by the highly compressed rod 16, which then has a small diameter and can be fitted further into the cylinder head. The masses of components to be accelerated and the fuel volumes undergoing compression, both of which sap time and energy between the transducer 14 and the spool 52, are all minimized by locating the rod 16 as close to the tip of the injector 10 as possible, wherein in one embodiment, the rod 16 is adjacent the injector nozzle spool 52 on the inboard end opposite the spool tip. Leakage enables such a location by ensuring that the rod 16 and its coil 20 will not get too hot. Excess heat from the engine cylinder head will be removed by the leakage, to then be dissipated in the fuel tank. As the fuel is injected such that it does not raise the bulk temperature of the gases in the engine combustion chamber, this cooling requirement is correspondingly reduced.

To transmit mechanical work across its boundary, the rod 16 must be packaged and excited such that it can exert net force over a distance. Because the rod 16 is a cyclical device, there must be a net difference within each cycle in the amount of mechanical work performed. For example, the force exerted by the rod 16 expanding against the pressure in the hydraulic chamber 42 must be different from the force exerted when it permits the pressure to compress it. Force is the product of stress T times rod cross-sectional area normal to its strain direction S and distance is the product of strain S times rod length. Because net work from a cyclical device requires both stress and strain of the transducing material to change within each cycle, the usefulness of plotting the data as shown in FIG. 1 is demonstrated.

The programmable features of the present invention include:
  a thin solenoid coil 20 of relatively few turns,
  the ability of an electrical source 62 electrically controlled by a control unit 64 to proportionally supply up to one hundred amperes at up to one hundred volts in no greater than ten microseconds,
  the rod 16 being subject to a bias compressive stress magnitude of greater than fifteen megapascals,
  accelerated mass being minimized,
  the magnetic flux path being minimized and designed to suppress eddy currents,
  the preload being applied to the rod 16 by a master piston 30 employing the supply pressure of the diesel fuel,
  the valve element vectorially separating control forces from the forces being controlled, and
  the valve element operating in substantially the same direction as the rod 16.

The features and advantages described in the specification are not all inclusive, and particularly, many additional features and advantages will be apparent to one of ordinary skill in the art in view of the drawings, specification, and claims hereof. Moreover, it should be noted that the language used in the specification has been principally selected for readability and instructional purposes, and may not have been selected to delineate or circumscribe the inventive subject matter, resort to the claims being necessary to determine such inventive subject matter.

Those of ordinary skill in the art will realize that the description of the present invention is illustrative only and not in any way limiting. Other embodiments of the invention will readily suggest themselves to such skilled persons.

The embodiment disclosed herein was chosen and described in order best to explain the principles of the invention and its practical application, thereby to enable others skilled in the art best to utilize the invention in various embodiments and with various modifications as are suited to the particular use contemplated therefore. It is intended that the scope of the invention be defined by the claims appended hereto, when interpreted in accordance with the full breadth to which they are legally and equitably entitled.

What is claimed is:

1. A fuel injection device for internal combustion engines comprising:
  a case;
  a transducer for converting electrical input to mechanical output having a rod, the rod having a compressive preload, the compressive preload provided through fuel pressure;
  said transducer having a solenoid coil; and
  a valve in communication with the transducer to provide fuel to an engine combustion chamber wherein the valve vectorially separates transducer forces from pressure induced forces when fuel is supplied to the engine combustion chamber.

2. The device of claim 1 wherein the rod has ends that are parallel to each other and is made of a solid magnetostrictive material with a preferred direction of magnetostrictive response.

3. The device of claim 2 wherein the shape is chosen from the group consisting of cylinder, ellipsoid, parallelipiped and prismatic shapes.

4. The device of claim 1 wherein fuel pressure provides greater than fifteen megapascals of compressive stress on the rod.

5. The device of claim 4 wherein the case has a liquid chamber that traps a substantially constant volume of pressurized liquid when the rod actuates the master piston.

6. The device of claim 1 wherein the valve comprises:
  a valve body having at least one orifice exiting into an engine combustion chamber;
  a valve element driven by a slave piston to slide axially between a first position and a second position; and
  a restoring element that urges the valve element toward the first position.

7. The device of claim 2 where the transducer comprises the rod disposed through a case and a solenoid coil disposed concentrically around the rod and adapted to excite the magnetostrictive material of the rod into mechanical motion.

8. The device of claim 7 wherein the magnetostrictive material comprises a grain oriented polycrystalline rare earth-transition metal magnetostrictive material of the formula Tb.sub.xDy.sub.1-xFe.sub.2-w wherein 0.20<=x<=1.00 and 0<=w<=0.20 wherein the grains of the material have their common principal axes substantially pointed along the growth axis of the material which is within 10.degree. of the .lamda..sub.111 axis.

9. The device of claim 7 wherein the magnetostrictive material is a rare earth-transition metal magnetostrictive material divided by a plurality of joints into an element of discrete magnetostrictive slabs.

10. The device of claim 7 wherein the magnetostrictive material is a rare earth-transition metal magnetostrictive material having a transverse dimension less than one quarter wavelength at the electromechanical resonant frequency of the apparatus.

11. The device of claim 7 wherein the magnetostrictive material is a rare earth-transition metal magnetostrictive material having a length in the direction of magnetostrictive response of no greater than one quarter wavelength at the electromechanical resonant frequency of the apparatus.

12. The device of claim 7 further comprising a magnetic flux return path circuit made from ferromagnetic material.

13. The device of claim 12 wherein the magnetic flux return path circuit surrounds the solenoid coil from one end of the magnetostrictive material to the other.

14. The device of claim 12 wherein permanent magnets are incorporated in the magnetic flux return path circuit.

15. The device of claim 4 wherein the valve has a slave piston that moves in a direction not the same as the master piston.

16. The device of claim 5 wherein the liquid is supplied to and trapped in the chamber by a check valve in fluid communication with the high pressure source.

17. The device of claim 5 wherein the liquid is supplied to and trapped in the chamber by a labyrinthine passage in fluid communication with the high pressure source.

18. The device of claim 6 wherein the restoring element is a spring.

19. The device of claim 1 wherein the rod has ends that are substantially parallel to each other and is made of a solid piezoelectric material with a preferred direction of piezoelectric response.

20. The device of claim 19 wherein the shape is chosen from the group consisting of cylinder, ellipsoid, parallelipiped and prismatic shapes.

21. A fuel injection device for internal combustion engines comprising:
  a case;

a transducer for converting electrical input to mechanical output having a rod, the rod having a compressive preload, the compressive preload provided through fuel pressure; and a valve in communication with the transducer to supply fuel to an engine combustion chamber.

22. A method for injecting fuel into an engine combustion chamber steps comprising:

sending an electrical input signal from a control unit to a solenoid coil to excite a rod of magnetostrictive material, the rod having a compressive preload, the compressive preload provided through fuel pressure within the solenoid coil;

vectorially separating actuator forces from pressure induced forces with a valve in communication with the transducer; and actuating the valve to inject fuel into an engine combustion chamber.

23. The method of claim 22 wherein the control unit operates in analog fashion.

24. The method of claim 22 wherein the control unit operates in binary fashion.

25. The method of claim 22 wherein the control unit operates in pulse width modulated fashion.

26. The method of claim 22 further comprising the step of axially modulating the valve with a slave piston to any position in between full open and full closed positions.

27. The method of claim 22 wherein the electrical input signal comprises a main current signal with a superposed alternating signal.

28. The method of claim 22 further comprising the step of exciting the solenoid coil with an electrical current that causes magnetic domains of the rod to rotate into alignment before sending the electrical input signal.

29. The method of claim 22 wherein the valve oscillates sinusoidally when actuated.

* * * * *